United States Patent
Chang

(10) Patent No.: US 6,690,221 B1
(45) Date of Patent: Feb. 10, 2004

(54) METHOD AND APPARATUS TO DELAY SIGNAL LATCHING

(75) Inventor: Stephen S. Chang, Glendora, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/453,669

(22) Filed: Dec. 3, 1999

(51) Int. Cl.[7] .................................................. H03K 3/12
(52) U.S. Cl. ......................... 327/199; 327/218; 326/94
(58) Field of Search ................................ 327/199–202, 327/203–214, 218, 219, 261, 284, 271; 365/154, 156, 189.05, 205; 377/115–117; 326/93–98; 714/744

(56) References Cited

U.S. PATENT DOCUMENTS

| | | | | |
|---|---|---|---|---|
| 4,584,683 A | * | 4/1986 | Shimizu | 714/736 |
| 4,929,850 A | * | 5/1990 | Breuninger | 326/94 |
| 4,961,013 A | * | 10/1990 | Obermeyer et al. | 326/16 |
| 5,068,881 A | * | 11/1991 | Dervisoglu et al. | 377/70 |
| 5,243,456 A | * | 9/1993 | Hirakata | 327/176 |
| 5,878,055 A | * | 3/1999 | Allen | 714/744 |

* cited by examiner

Primary Examiner—Minh Nguyen
(74) Attorney, Agent, or Firm—Blakely, Sokoloff, Taylor & Zafman LLP

(57) ABSTRACT

An apparatus includes a first latch having an output terminal. A latch signal is received by the first latch. A second receives the latch signal and having an input terminal coupled to the output terminal of the first latch. A delay circuit delays the latch signal to the first latch.

8 Claims, 3 Drawing Sheets

METHOD AND APPARATUS TO DELAY SIGNAL LATCHING

BACKGROUND

1. Field

The invention relates to a field of digital circuitry, and more particularly to digital latching circuits.

2. Background Information

One conventional circuit to latch signals is called the flip-flop. A so-called "D" style flip-flop, well known in the art, may be implemented using a pair of latch circuits known as a master-slave latch pair. The master-slave latch pair may be arranged in a cascade configuration, such that the data output terminal Q of the master latch is coupled to the data input terminal D of the slave latch. The master latch may receive a data signal on a master data input D and, upon receiving a latch signal, propagate the data signal to master data output terminal Q. The latch signal may be received on a master latch terminal C. The data signal may be propagated to the master output terminal Q when the latch signal achieves a first predetermined voltage level. This first predetermined voltage level may correspond to logical "high" or logical "low" in binary signal systems. The slave latch receives the data signal at slave data input terminal D. The slave latch propagates the data signal to a slave output terminal Q upon receiving an inverted latch signal at slave latch terminal C. The inverted latch signal received by the slave latch may be an inverted form of the latch signal received by the master latch.

In other words, the data signal at the input terminal of the master latch (this may also act as the input terminal of the flip-flop) is "latched", e.g. stored to the output terminal of the master latch when the latch signal achieves a first predetermined voltage level. The data signal is propagated to the output terminal of the slave latch (which may also act as the output terminal of the flip-flop) when the latch signal (which is inverted when received by the slave latch) achieves a second predetermined voltage level (the inverted level of the first predetermined voltage level).

One problem with conventional flip-flops is that the latch signal may arrive before the data signal has become stable at the data input terminal. Once the data signal arrives at the data terminal, an amount of time called the setup time must typically elapse before the master latch is capable of latching the data signal. This amount of time is known as the setup time for the flip-flop. If the clock signals arrives before the setup time has elapsed the flip-flop may not function as intended. In particular, the flip-flop may latch a signal which is not an accurate representation of the data signal.

One approach to this problem is to delay the latch signal so that it arrives at the latch terminals later. This gives the data signal more time to settle at the data input terminal of the flip-flop. A disadvantage of this approach is that the output signal of the flip-flop is delayed by an amount of time which may be directly proportional to the amount of time which the latch signal is delayed. The longer the latch signal is delayed the longer the output of the flip-flop is delayed. If other circuits depend upon receiving the output of the flip-flop, operation of those circuits may also be delayed by a corresponding amount of time.

There exists a continuing need for a technique by which the latching of the data signal may be delayed by an interval of time without delaying the output signal of the flip-flop by a proportional interval of time.

SUMMARY

According to an embodiment of the invention, An apparatus includes a first latch having an output terminal. A latch signal is received by the first latch. A second receives the latch signal and has an input terminal coupled to the output terminal of the first latch. A delay circuit delays the latch signal to the first latch. An inverter inverts the latch signal to the first latch. Other embodiments are also described and claimed.

BRIEF DESCRIPTION OF THE DRAWINGS

The subject matter regarded as the invention is particularly pointed out and distinctly claimed in the concluding portion of the specification. The invention, however, may be further understood by reference to the following detailed description read with reference to the accompanying drawings.

DETAILED DESCRIPTION

The embodiments described herein are merely illustrative, and one skilled in the art will appreciate that numerous modifications can be made which nonetheless fall within the scope of the present invention.

Figure 1:
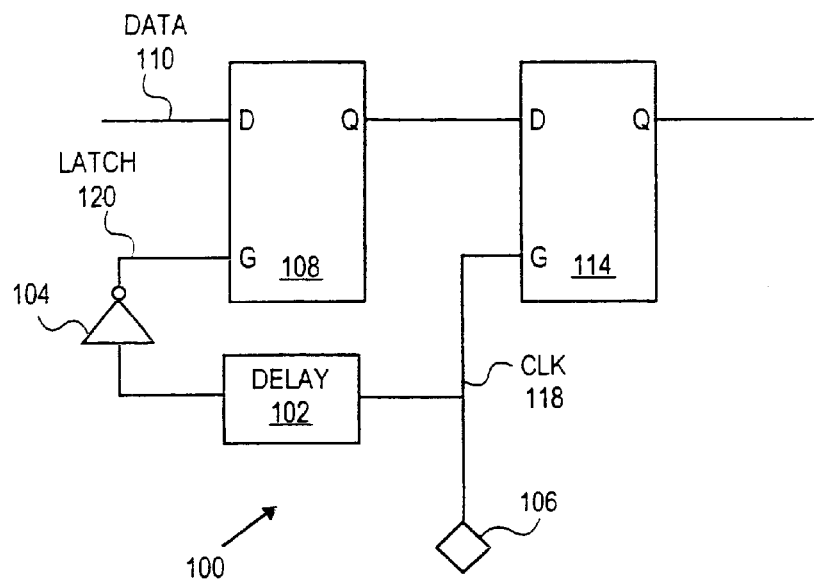
FIG. 1 shows an embodiment of an apparatus in accordance with the present invention.

FIG. 1 shows an embodiment 100 of an apparatus in accordance with the present invention. Embodiment 100 comprises a master latch 108 and a slave latch 114. Master latch 108 receives a data signal 110 (DATA) on master latch data terminal D. Output terminal Q of master latch 108 is coupled to data terminal D of slave latch 114. Master latch 108 propagates DATA to master output terminal Q when a latch signal 120 (LATCH) achieves a first predetermined voltage level at master latch terminal G. For example, in one embodiment master latch 108 propagates DATA to master output terminal Q when LATCH achieves logical high. Slave 114 receives latch signal 118 (CLK) at slave latch terminal G. CLK is produced by signal source 106. Due to the operation of inverter 104, CLK is an inverted form of LATCH (and vice versa).

Embodiment 100 further comprises delay circuit 102 coupled between signal source 106 and master latch terminal G. Delay 102 delays the time when master 108 receives LATCH, relative to when slave 114 receives CLK. An embodiment of delay is described more fully in FIG. 2.

Figure 2:
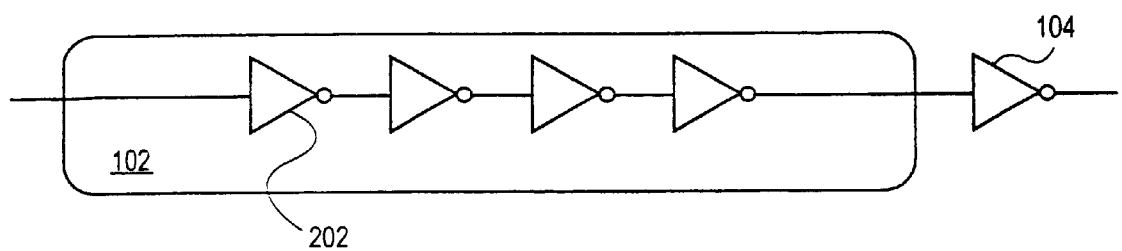
FIG. 2 shows an embodiment of a delay circuit in accordance with the present invention.

FIG. 2 shows an embodiment of a delay circuit 102 in accordance with the present invention. Delay 102 comprises a plurality of inverters 202 coupled in series. Combined propagation delays of the inverters may act to produce an overall delay to a signal along the signal path coupling the inverters. Thus, CLK may be applied to input of delay 102 to produce LATCH, which is a delayed form of CLK. Of course, many other types of delay implementations will be apparent to those skilled in the art and are within the scope of the present invention.

Figure 3:
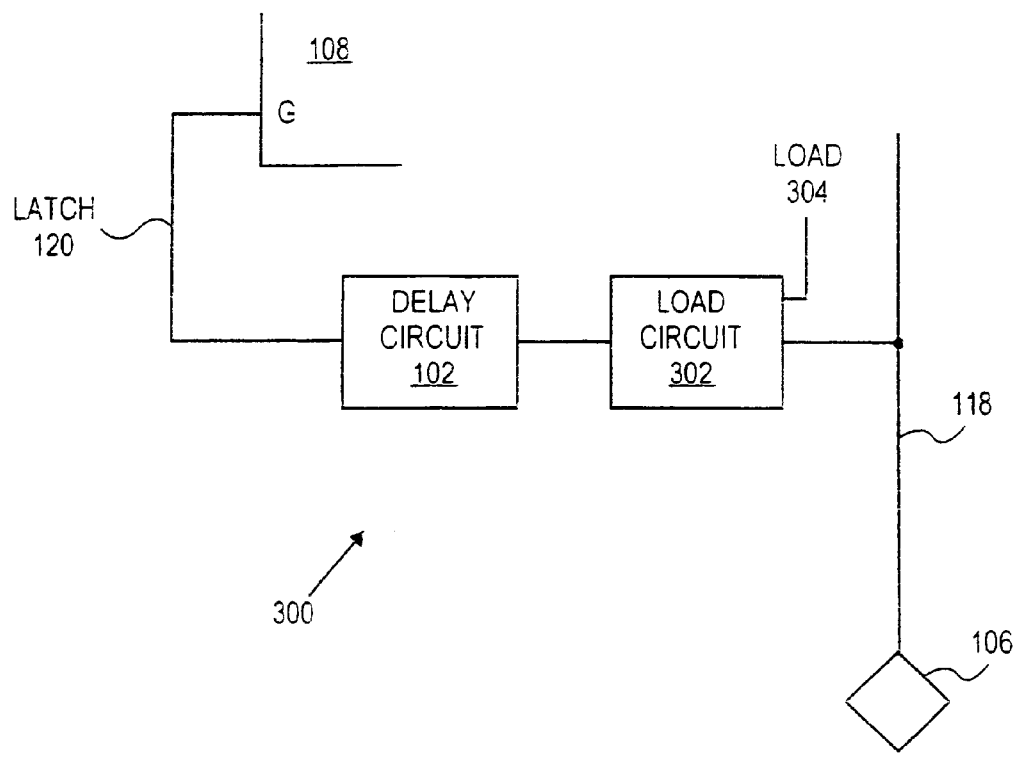
FIG. 3 shows another embodiment of an apparatus in accordance with the present invention.

FIG. 3 shows another embodiment 300 of an apparatus in accordance with the present invention. A load circuit 302 may be coupled between delay 102 and signal source 106. Load circuit 302 receives CLK and a load signal 304 (LOAD). Load circuit 302 may provide additional control over timing of LATCH in a manner described below.

Figure 4:
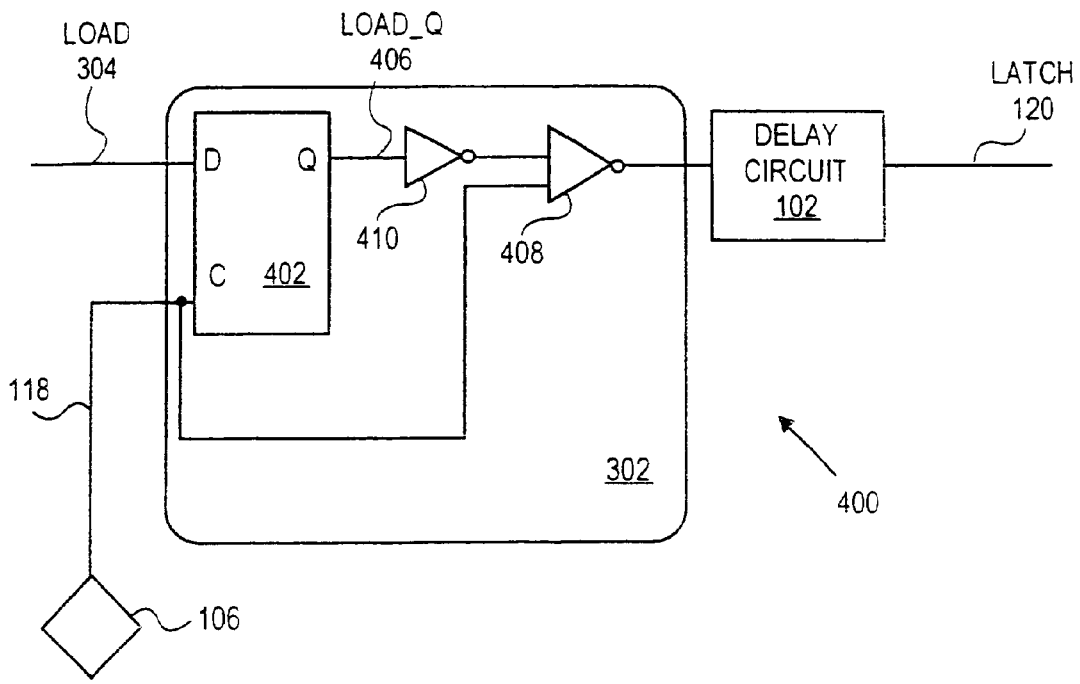
FIG. 4 shows an embodiment of load circuit in accordance with the present invention.

FIG. 4 shows an embodiment 400 of load circuit 302 in accordance with the present invention. Embodiment 400 comprises a D flip-flop 402 with an output terminal Q coupled to a first input of NOR circuit 408 by way of inverter 410. A second input of NOR circuit 408 is coupled to receive CLK 118. Flip-flop 402 latches LOAD when CLK achieves a first predetermined voltage level—logical high in this embodiment. The latched LOAD is labeled $LOAD_{13}$ Q 406. An output signal of XOR circuit 408 is high when LOAD_Q is high and CLK is low. LOAD_Q will be high when the latched LOAD is high. LATCH will be low (e.g. will not cause master latch 108 to latch DATA) when LOAD is low. Master 108 will not latch DATA unless LOAD is high. Thus, LOAD may control when DATA is latched.

Of course, those skilled in the art will recognize that load circuit 302 could be reconfigured to latch DATA when LOAD is low. Numerous other modifications and embodiments of load circuit 302 are also within the scope of the present invention. For example, different logic circuits (such as an AND gate) could be employed in place of NOR circuit 408 with similar results.

Figure 5:
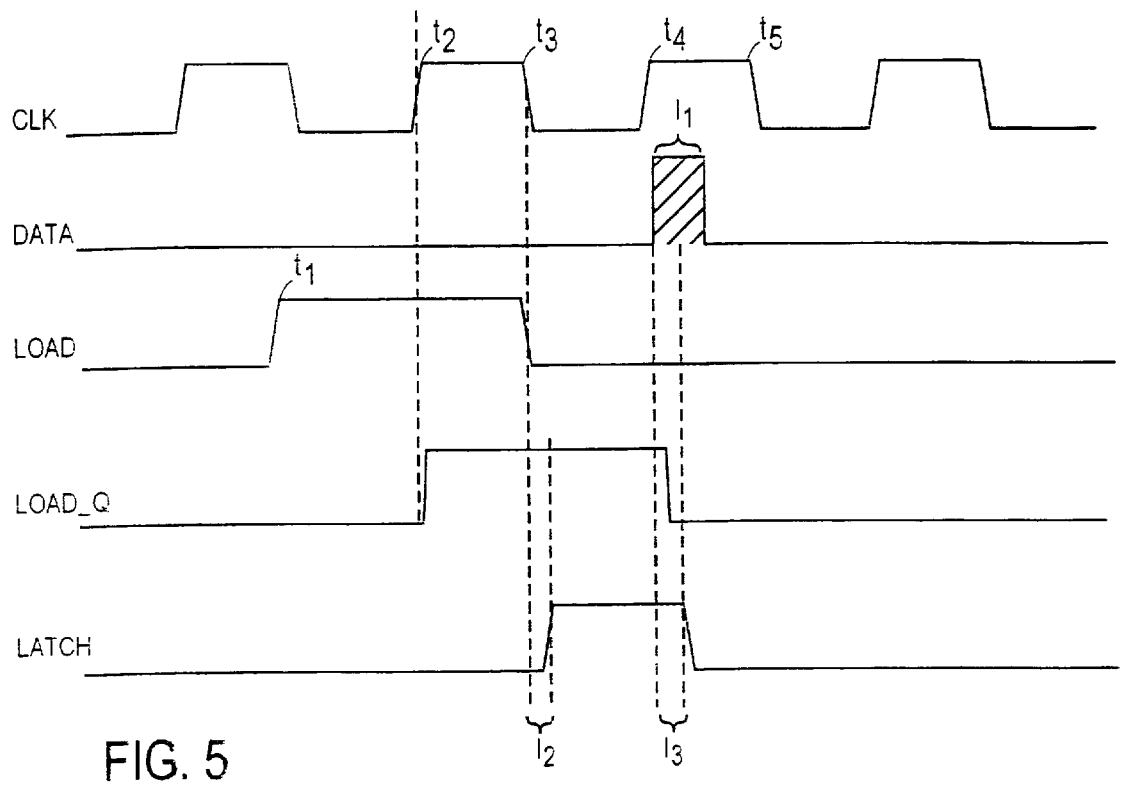
FIG. 5 illustrates various signals in accordance with an embodiment of the present invention.

FIG. 5 illustrates various signals in accordance with an embodiment of the present invention. Signals CLK, DATA, LOAD, LOAD_Q, and LATCH are illustrated. At a time t1 LOAD transitions from low to high. When CLK next transitions to high at time t2, LOAD is latched by flip-flop 402 at LOAD_Q goes high. LOAD signal goes low at a time t3. CLK is now low and $LOAD_{13}$ Q is high; thus, LATCH goes high after the delay interval provided by delay circuit 102 elapses. This delay interval is illustrated as I2. Master 108 latches DATA during the entire interval when LATCH is high. This interval includes the interval I3. During the interval I3, master 108 is latching DATA and DATA has had a chance to settle at the data input terminal of master 108. Once DATA is settled, it is said to be valid. DATA is valid during the interval I1, which overlaps the latching interval during I3. Thus, master 108 will latch valid DATA during I3. Note that, if LATCH had not been delayed by I2, LATCH would have gone low at approximately t4. Thus LATCH would not have been high during an interval of time when DATA was valid, and valid DATA may not have been latched.

Note that slave latch 114 may propagate the latched DATA to the slave output terminal Q beginning at approximately time t4, when CLK goes high. Valid DATA is latched at approximately time t4 (the beginning of time interval I3) and is available at slave output terminal a short time after that. The delay from when valid DATA is available at master data input D to the time when it available at slave output terminal is approximately $$2* Dp$$

where Dp is the individual signal propagation delay of the master and slave latches.

Valid DATA remains available at slave output terminal until LOAD again goes high resulting in LATCH again going high. Thus, the time at which valid DATA appears at the slave output terminal, and hence the time at which valid DATA is available to circuits coupled to slave output terminal, is not delayed in proportion to the delay interval I3 provided by delay circuit 102. If more setup time for DATA is desired, delay interval I3 may be increased without delaying the time at which valid DATA appears at the slave output terminal proportionally.

Figure 6:
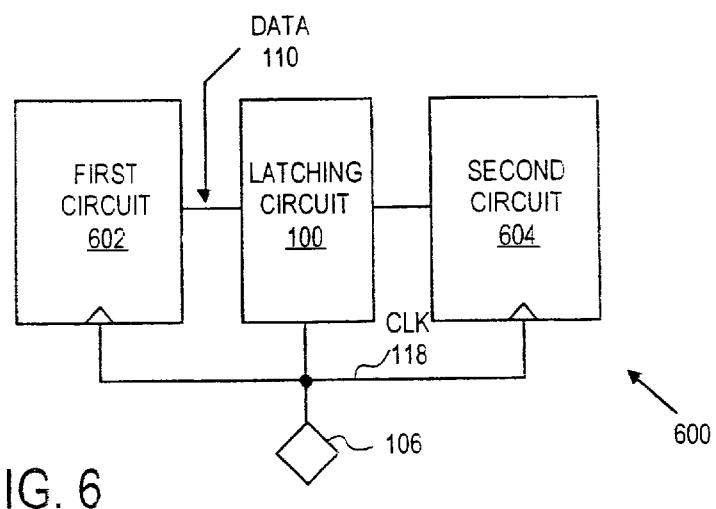
FIG. 6 shows one embodiment of a system in accordance with the present invention.

FIG. 6 shows one embodiment 600 of a system in accordance with the present invention. A first circuit 602 is coupled to circuit embodiment 100 (see FIG. 1) and provides DATA to the data input terminal of circuit 100. A second circuit 604 is coupled to slave output terminal Q of circuit 100 to receive latched DATA. Each of the circuits is coupled to signal source 106, e.g. the system is commonly clocked. Upon receipt of CLK circuit 602 provides DATA to circuit 100. Due to operating latencies in circuit 602, DATA is provided late to circuit 100. A conventional flip-flop operating in this system might latch invalid DATA, due to the fact that the setup time for the DATA may not have elapsed when the flip-flop receives CLK. However, circuit 100 may delay latching of DATA until DATA is valid (e.g. setup time for DATA has elapsed). Despite the delay in latching DATA, DATA may be provided to circuit 604 without substantial delay in accordance with the present invention.

A circuit and/or system in accordance with the present invention may be useful, for example, in processor-based devices such as computer systems. A computer system is any device comprising a processor and a memory coupled to the processor by way of a bus, the memory to provide instruction and/or data signals to the processor by way of the bus. The processor may execute the instructions in accordance with and/or operating upon the data, said execution resulting in signals produced within the system. In modern computer systems, situations may arise in which additional set-up time to latch signals produced as a result of execution of instructions is desired. The present invention provides a mechanism for providing such additional set-up time without a proportional delay in the signals output by said latches.

While certain features of the invention have been illustrated as described herein, many modifications, substitutions, changes and equivalents will now occur to those skilled in the art. It is, therefore, to be understood that the appended claims are intended to cover all such embodiments and changes as fall within the true spirit of the invention.

What is claimed is:

1. An apparatus comprising:

a first latch to receive a latch signal, the first latch having an output terminal;

a second latch to receive the latch signal and having an input terminal coupled to the output terminal of the first latch; and a delay circuit to delay the latch signal to the first latch and a circuit to invert the latch signal to the first latch, connected so that the latch signal as received by the first latch is both delayed and inverted.

2. The apparatus of claim 1 wherein the delay circuit is designed to provide a time delay sufficient to meet a set-up time of the first latch.

3. The apparatus of claim 1 further comprising:

a load circuit coupled to the delay circuit to control when the latch signal is received by the first latch according to a load signal.

4. The apparatus of claim 1 in which the delay circuit further comprises:

a plurality of inverters coupled in series.

5. A computer system comprising:

a processor;

a first circuit to produce a signal as a result of execution of an instruction by the processor;

a second circuit; and a first level sensitive latch to receive the signal from the first circuit and a latch signal, the first latch to provide the signal to an output terminal upon receiving the latch signal;

a second level sensitive latch to receive the latch signal and having an input terminal coupled to the output terminal of the first latch, the second latch to provide the signal present on the input terminal to the second circuit upon receiving the latch signal; and a delay circuit to delay the latch signal to the first latch and a circuit to invert the latch signal to the first latch, connected so that the latch signal as received by the first latch is both delayed and inverted.

6. The system of claim 5 wherein the delay circuit is designed to provide a time delay sufficient to meet a set-up time of the first latch.

7. The system of claim 5 further comprising:

a load circuit coupled to the delay circuit to control when the latch signal is received by the first latch according to a load signal.

8. The system of claim 5 in which the delay circuit further comprises:

a plurality of inverters coupled in series.

* * * * *

UNITED STATES PATENT AND TRADEMARK OFFICE
CERTIFICATE OF CORRECTION

PATENT NO.    : 6,690,221 B1                                                           Page 1 of 1
DATED         : February 10, 2004
INVENTOR(S)   : Chang It is certified that error appears in the above-identified patent and that said Letters Patent is hereby corrected as shown below:

Column 3,
Line 14, delete "$LOAD_{13}$" and insert -- $LOAD_{\_}$. --.
Line 34, delete "$LOAD_{13}$" and insert -- $LOAD_{\_}$. --.

Signed and Sealed this

First Day of June, 2004

JON W. DUDAS
*Acting Director of the United States Patent and Trademark Office*